United States Patent
Togo et al.

[19]

[11] Patent Number: 5,877,625
[45] Date of Patent: Mar. 2, 1999

[54] MAGNETIC SENSOR WITH SUPPORTING ELEMENT FOR SUPPORTING OUTPUT LEAD WIRE OF COIL

[75] Inventors: Ichiro Togo; Yasuaki Hata, both of Tokyo, Japan

[73] Assignee: Mitsubishi Denki Kabushiki Kaisha, Tokyo, Japan

[21] Appl. No.: 927,258

[22] Filed: Sep. 11, 1997

[30]     Foreign Application Priority Data

Feb. 26, 1997  [JP]  Japan ..................................... 9-042303

[51] Int. Cl.⁶ .............................. G01P 3/488; G01P 1/02; H01F 27/29
[52] U.S. Cl. ................. 324/174; 73/514.39; 324/207.15; 336/192
[58] Field of Search ...................... 324/173, 174, 324/207.15, 207.16; 73/660, 661, 514.39; 336/192; 310/155, 168; 29/595, 602.1, 605, 606

[56]              References Cited
              U.S. PATENT DOCUMENTS 5,363,033  11/1994  Suda et al. ....................... 324/207.15
5,689,182  11/1997  Togo et al. ....................... 324/207.15
5,744,951   4/1998  Babin et al. .................... 324/207.15 X

FOREIGN PATENT DOCUMENTS 2669736   5/1992  France .................................. 324/174
7-311211  5/1994  Japan .

*Primary Examiner*—Gerard Strecker
*Attorney, Agent, or Firm*—Sughrue, Mion, Zinn, Macpeak & Seas, PLLC

[57]                ABSTRACT

A magnetic sensor having a coil that is not damaged by the injection pressure of a molten resin. The magnetic sensor includes a bobbin having a winding core and flanges, a supporting element connected to the bobbin, a coil for detecting a change in the magnetic field as a change in voltage, the coil including a winding wire wound around the winding core, an output lead wire of the coil being drawn out through an output lead slot formed in one of the flanges, and a housing covering outer portions of the bobbin, coil, and supporting element, wherein the output lead wire is drawn out through the output lead slot at a height, measured in a radial direction of the bobbin, which is substantially equal to a height of an outer surface of an adjacent portion of the supporting element.

6 Claims, 7 Drawing Sheets

MAGNETIC SENSOR WITH SUPPORTING ELEMENT FOR SUPPORTING OUTPUT LEAD WIRE OF COIL

BACKGROUND OF THE INVENTION

1. Field of the Invention

The present invention relates to a magnetic sensor for detecting a change in magnetic field by detecting a corresponding change in voltage via a coil thereby detecting the position or the speed of revolution of an object.

2. Description of the Related Art

FIG. 13 is a cross-sectional view illustrating a conventional magnetic sensor in operation. FIG. 14 is a perspective view illustrating the general structure of the conventional magnetic sensor before being placed into a housing.

FIG. 15 is a cross-sectional view taken along line XV—XV of FIG. 14, and FIG. 16 is a cross-sectional view taken along line XVI—XVI of FIG. 15. The magnetic sensor 1 includes: a magnetic core 2; a bobbin 3 surrounding the magnetic core 2; a coil 4 consisting of a wire wound around the bobbin 3; a cylindrical supporting element 5 integrally connected to the bobbin 3; a magnet 6 in the form of, for example, a cylinder and a spacer 7 both placed inside the supporting element 5; a first electric terminal 8a and a second electric terminal 8b both protruding from the supporting element 5 in a radial direction; a tape 10 for pressing an input lead wire 9a and an output lead wire 9b of the coil 4 against the supporting element thereby fixing them to the supporting element 5; and a housing 11 in which the assembly 20 consisting of the above components 2, 3, 4, 5, 6, 7, 8a, 8b, and 10 are placed.

The bobbin 3 includes a winding core 15 around which the wire is wound, and flanges 12 disposed at either end of the winding core 15. One of the flanges 12 has an input lead slot 13 and an output lead slot 14 formed at locations opposite to the first electric terminal 8a and the second electric terminal 8b, respectively, wherein the input lead slot 13 and the output lead slot 14 extend in radial directions.

The process of producing the above magnetic sensor 1 is described below. First, the input lead wire 9a is put in through the input lead slot 13, and the wire is wound around the winding core 15 so as to form the coil 4 consisting of a plurality of wire layers. The output lead wire 9b extending from the outer periphery of the coil 4 is put out through the output lead slot 14 and is further placed on the supporting element 5 along its axis. The end of the input lead wire 9a is temporarily fixed to the first electric terminal 8a and the end of the output lead wire 9b is temporarily fixed to the second electric terminal 8b. The band-shaped fabric tape 10 is wound around the periphery of the supporting element 5 so that the input lead wire 9a and the output lead wire 9b are pressed against the supporting element 5 thereby fixing them to the supporting element 5. Then the end of the input lead wire 9a is firmly connected to the first electric terminal 8a by soldering. Similarly, the end of the output lead wire 9b is firmly connected to the second electric terminal 8b by soldering. The magnetic core 2 is placed into the bobbin 3, the magnet 6 and the spacer 7 are placed into the supporting element 5, and they are fixed together so that the complete assembly 20 is obtained.

The assembly 20 is then put in a mold, and a molten resin is injected into the mold so as to form the housing 11 surrounding the assembly 20 thereby obtaining the complete magnetic sensor 1.

In the magnetic sensor 1 described above, a magnetic path is formed such that a magnetic flux emerging from the magnet 6 passes through the magnetic core 2. When a signal detecting plate 16 having a projection 16a, made up of a magnetic material, is rotated, the distance between the magnetic sensor 1 and the signal detecting plate 16 varies with the rotation of the signal detecting plate 16. As a result, a change occurs in the magnetic flux emerging from the magnet 6. The change in the magnetic flux is detected as a change in voltage by the coil 4, and the signal detected by the coil 4 is transmitted to a computer unit(not shown) so that the speed of revolution of the signal detecting plate 16 is determined.

The conventional magnetic sensor 1 described above has the following problems. In order to achieve a high enough voltage for the detection signal of the magnetic sensor 1, the wire has to be wrapped around the winding core 15 many times. As a result, as shown in FIG. 15, the radius $X_1$ of the coil 4 generally becomes greater than the radius $X_2$ of the supporting element 5 and thus a difference in level is created between the outer periphery of the coil 4 and the outer periphery of the supporting element 5. This difference in level causes the output lead wire 9b, which extends though the output lead slot 14 and further extends along the axis of the supporting element 5, to have an oblique portion $9b_1$ extending away from the supporting element 5. Since this oblique portion $9b_1$ is separate from the outer periphery of the supporting element 5, the oblique part $9b_1$ by itself should withstand the injection pressure of the molten resin when the molten resin is injected into the mold to form the housing 11. As a result, great tensile stress is imparted to the output lead wire 9b, which can damage the coil 4.

It is desirable that the thickness of the flanges 12 be small enough so that the total length of the magnetic sensor 1 becomes small and the tape 10 can have a large pressing area. However, the thickness of the flanges 12 should be greater than about 1 mm so that the flanges 12 can withstand the injection pressure of the molten resin. One of the flanges 12 has the output lead slot 14 having a corner perpendicular to the winding direction of the winding wire of the coil 4. When the output lead wire 9b comes in contact with the right-angle corner, the output lead wire 9b can be damaged.

In view of the above, it is a general object of the present invention to solve the above problems.

More specifically, it is an object of the present invention to provide a magnetic sensor in which a coil does not become damaged due to the injection pressure of a molten resin.

It is an another object of the present invention to provide a magnetic sensor in which an output lead wire can be drawn out through an output lead slot without becoming damaged due to contact with a corner of the output lead slot.

SUMMARY OF THE INVENTION

According to an aspect of the invention, there is provided a magnetic sensor in which an output lead wire is drawn out through an output lead slot at a height, measured in a radial direction, which is substantially equal to the height, measured in a radial direction, of the outer surface of the adjacent portion of a supporting element.

A flat portion is preferably formed on the outer surface of the supporting element so that the output lead wire is placed on the flat portion.

Preferably, a contact portion is formed in the output lead slot so that the contact portion has an acute angle with respect to the winding direction of the winding wire, and furthermore a guide is formed on the supporting element near the flange so that the output lead wire is guided in a direction along the axis of the supporting element.

Furthermore, the flange and the guide are preferably formed in an integral fashion.

Preferably, a contact portion with a curved surface is formed in the output lead slot at its bottom and on its corner near the coil.

Furthermore, a positioning element is preferably formed on the supporting element so that at least one end of a tape for fixing the output lead wire to the supporting element is positioned by the positioning element.

DESCRIPTION OF THE PREFERRED EMBODIMENTS

First Embodiment

Figure 1:
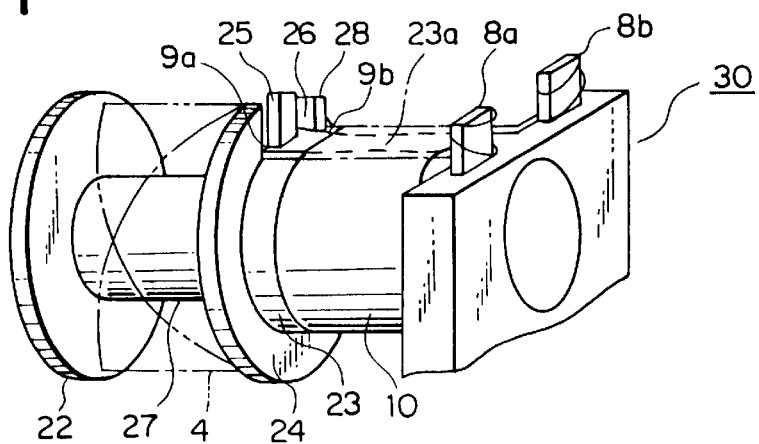
FIG. 1 is a perspective view of a magnetic sensor assembly according to a first embodiment of the invention.
Figure 2:
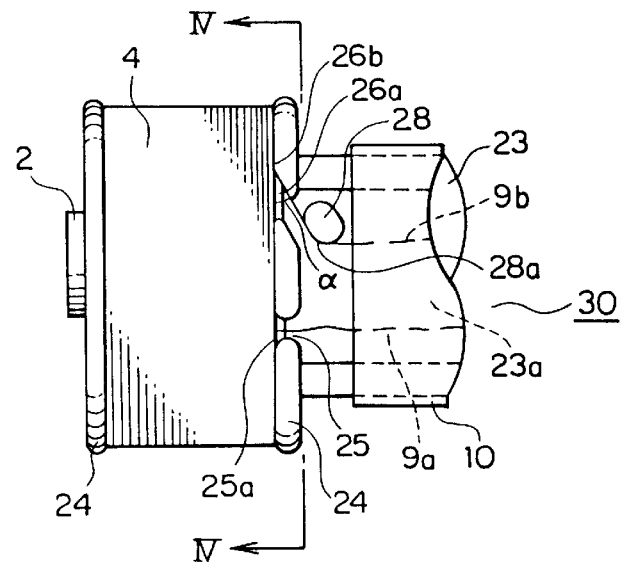
FIG. 2 is a plan view illustrating main parts of the magnetic sensor assembly shown in FIG. 1.
Figure 3:
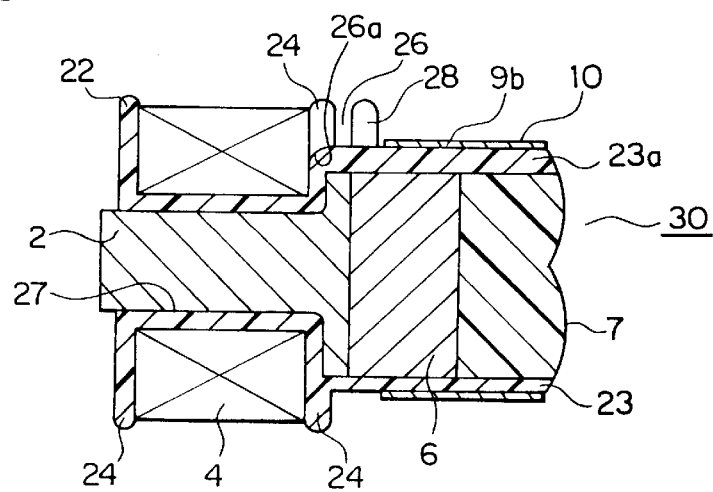
FIG. 3 is a sectional side view illustrating the main parts of the magnetic sensor assembly shown in FIG. 2.
Figure 4:
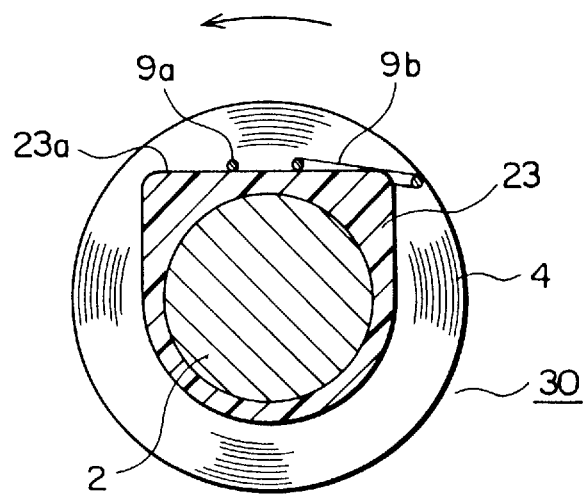
FIG. 4 is a cross-sectional view taken along line IV—IV of FIG. 2 (wherein flanges are not shown in FIG. 4)

FIG. 1 is a perspective view of a magnetic sensor assembly according to a first embodiment of the invention. FIG. 2 is a plan view illustrating the main parts of the magnetic sensor assembly shown in FIG. 1. FIG. 3 is a sectional side view illustrating the main parts of the magnetic sensor assembly shown in FIG. 2. FIG. 4 is across-sectional view taken along line IV—IV of FIG. 2(wherein the flanges are not shown in FIG. 4). In these figures, parts similar to those in FIG. 13 to FIG. 16 are denoted by similar reference numerals, and they are not described in further detail.

The magnetic sensor includes: a magnetic core 2; a bobbin 22 surrounding the magnetic core 2; a coil 4 consisting of a wire wound around the bobbin 22; a cylindrical supporting element 23 integrally connected to the bobbin 22; a magnet 6 in the form of, for example, a cylinder and a spacer 7 both placed inside the supporting element 23; a first electric terminal 8a and a second electric terminal 8b both protruding from the supporting element 23 in a radial direction; a tape 10 for pressing an input lead wire 9a and an output lead wire 9b of the coil 4 against the supporting element 23 thereby fixing them to the supporting element 23; and a housing 11 (same as in FIG. 13) in which the assembly 30 consisting of the above components: 2, 22, 4, 23, 6, 7, 8a, 8b, and 10 are placed. The bobbin 22 and the supporting element 23 are made in an integral fashion using a non-magnetic material such as PBT (polybutylene terphthalate), PP (polypropylene),nylon, or epoxy resin.

The bobbin 22 includes a winding core 27 around which the wire is wound, and flanges 24 disposed at either end of the winding core 27. One of the flanges 24 has an input lead slot 25 and an output lead slot 26 disposed at locations opposite to the first electric terminal 8a and the second electric terminal 8b, respectively. The input lead 5 lot 25 has a contact portion 25a with a curved surface formed in the input lead slot 25 at its bottom and on the side near the winding core 27 so that the input lead wire 9a is drawn in along the curved surface of the contact portion 25a.

The output lead slot 26 has a first contact portion 26a with a curved surface formed in the output lead slot 26 at its bottom and on the side near the winding core 27 so that the output lead wire 9b is drawn out along the curved surface of the contact portion 26a. Furthermore, a second contact portion 26b is formed on the side face of the output lead slot 26 wherein the second contact portion 26b is formed at an acute angle α with respect to the direction in which the winding wire of the coil 4 is wound.

The supporting element 23 has a flat portion 23a formed at its upper portion. The flat portion 23a is formed such that the height of its flat surface is coincident with the height of the bottom of the output lead slot 26 at the side of the supporting element 23. A guide 28, whose horizontal cross section has an expanded circular shape (a combination of a rectangle with two semi-circles connected to either end of the rectangle), is disposed on the flat portion 23a, at a location near the output lead slot 26. A side face of the guide 28 has a contact portion 28a formed into a curved surface so that it serves to guide the output lead wire 9b toward the second electric terminal 8b.

The procedure for producing the above magnetic sensor 21 is described below. The input lead wire 9a is put through the input lead slot 25, and the wire is wound around the winding core 27 of the bobbin 22 so as to form the coil 4 with a plurality of wire layers. The output lead wire 9b is drawn out from the outer periphery of the coil 4 through the output lead slot 26 toward the supporting element 23 and is placed on the flat portion 23a of the supporting element 23. The end of the input lead wire 9a is temporarily fixed to the first electric terminal 8a and the end of the output lead wire 9b is temporarily fixed to the second electric terminal 8b. The band-shaped tape 10 is then wound around the periphery of the supporting element 23 so that the input lead wire 9a and the output lead wire 9b are pressed against the supporting element 23 thereby fixing them to the supporting element 23. Then the end of the input lead wire 9a is firmly connected to the first electric terminal 8a by soldering. Similarly, the end of the output lead wire 9b is firmly connected to the second electric terminal 8b by soldering. The magnetic core 2 is placed into the bobbin 22, the magnet 6, and the spacer 7 are placed into the supporting element 23, and they are fixed together so that the complete assembly 30 is obtained. The assembly 30 is then put in a mold, and a molten resin is injected into the mold so as to form the housing 11 surrounding the assembly 30 thereby obtaining a complete magnetic sensor.

In this magnetic sensor constructed in the abovedescribed manner, the output lead wire 9b is drawn through the output lead slot 26 along the first contact portion 26a and the second contact portion 26band is then guided by the contact portion 28a of the guide 28 onto the flat portion 23a.

When the output lead wire 9b is drawn onto the flat portion 23a, the output lead wire 9b passes along the curved surface of the first contact portion 26a, and is bent at the second contact portion 26b by the amount of an acute angle α with respect to the winding direction of the coil 4. This ensures that the output lead wire 9b is prevented from being damaged in the middle of its path.

Furthermore, since the output lead wire 9b is drawn out through the output lead slot 26 at a height, measured in a radial direction, which is substantially equal to the height of the surface of the flat portion 23a of the supporting element 23, the output lead wire 9b, after emerging through the output lead slot 26, extends along the upper surface of the flat portion 23a toward the second electric terminal 8b without having a part separate from the flat portion 23a even in a region near the flange 24.

Second Embodiment

Figure 5:
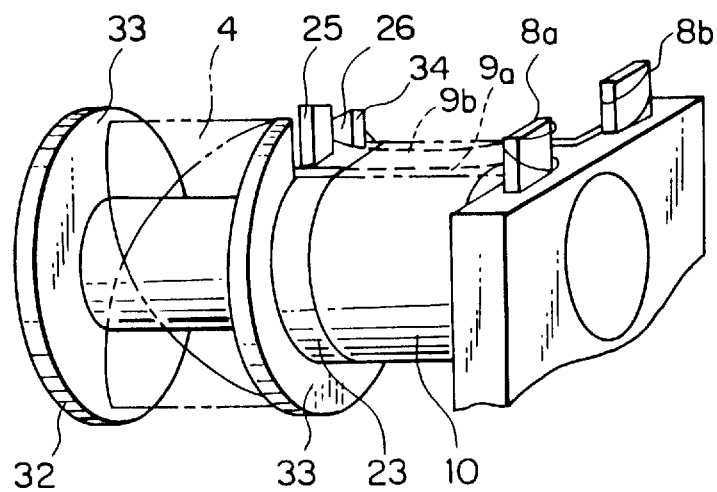
FIG. 5 is a perspective view illustrating the general structure of a magnetic sensor assembly according to a second embodiment of the invention.
Figure 6:
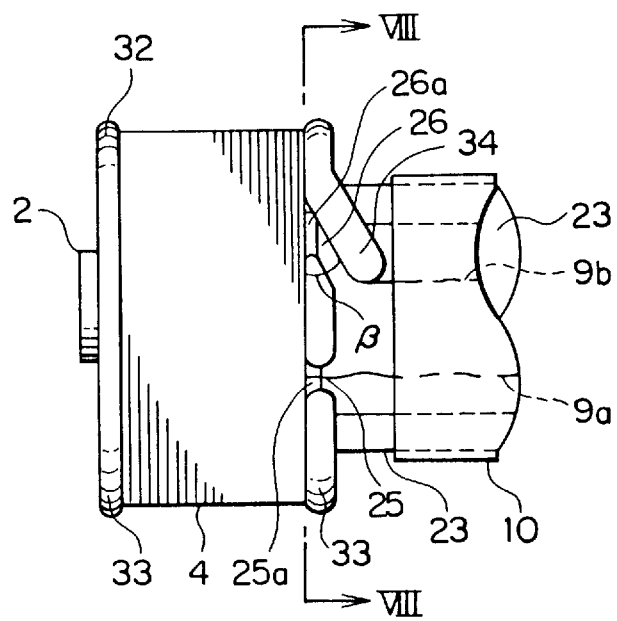
FIG. 6 is a plan view illustrating main parts of the magnetic sensor assembly shown in FIG. 5.
Figure 7:
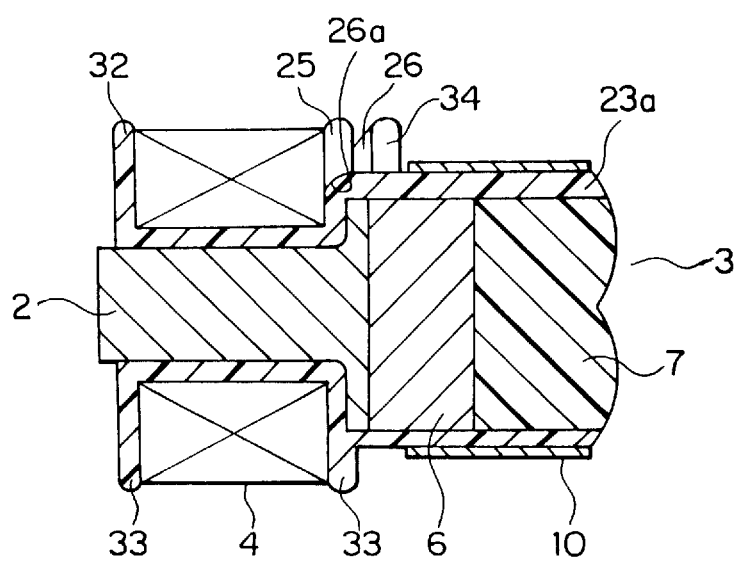
FIG. 7 is a cross-sectional view taken along line VII—VII of FIG. 6.
Figure 8:
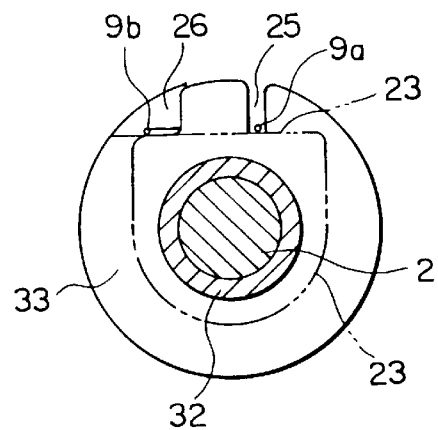
FIG. 8 is a cross-sectional view taken along line VIII—VIII of FIG. 6.

FIG. 5 is a perspective view illustrating the general structure of a magnetic sensor assembly according to a second embodiment of the invention. FIG. 6 is a plan view illustrating main portions of the magnetic sensor assembly shown in FIG. 5. FIG. 7 is a sectional side view illustrating the main parts of the magnetic sensor assembly shown in FIG. 6. FIG. 8 is a cross-sectional view taken along line VIII—VIII of FIG. 6. This magnetic sensor is different from that according to the first embodiment in that a flange 33 and a guide 34 are formed in an integral fashion.

As shown in FIG. 6, the guide 34 is bent at an acute angle β with respect to the winding direction of the coil 4.

In this magnetic sensor, since the flange 33 and the guide 34 are formed in the integral fashion, the bobbin 32 and the supporting element 23 can be formed in an integral fashion by means of a resin molding technique using a mold having a rather simple structure compared to the one employed in the first embodiment.

Third Embodiment

Figure 9:
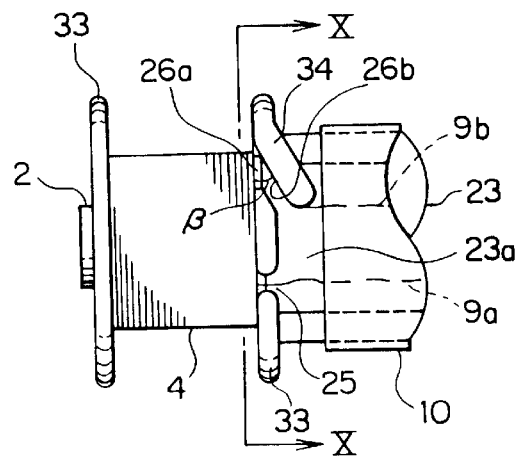
FIG. 9 is a plan view illustrating main parts of a magnetic sensor assembly according to a third embodiment of the invention.
Figure 10:
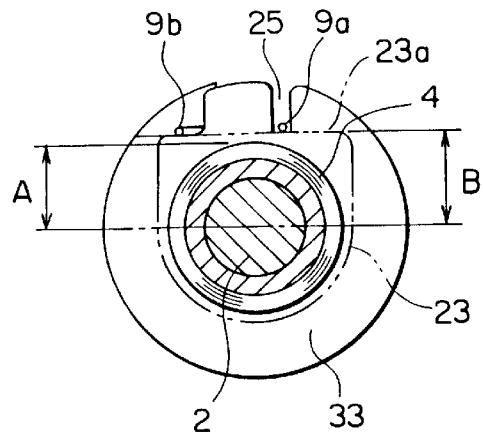
FIG. 10 is a cross-sectional view taken along line X—X of FIG. 9.

FIG. 9 is a plan view illustrating the main parts of a magnetic sensor assembly according to a third embodiment of the invention. FIG. 10 is a cross-sectional view taken along line X—X of FIG. 9. This magnetic sensor according to the third embodiment is different from that according to the second embodiment in that the radius A of the coil 4 is smaller than the size B of the supporting element 23.

Also in this embodiment, the output lead wire 9b, after being drawn onto the flat portion 23a, passes along the curved surface of the first contact portion 26a, and is bent at the second contact portion 26b by the amount of an acute angle β with respect to the winding direction of the coil 4. This ensures that the output lead wire 9b is prevented from being damaged in the middle of its path.

Fourth Embodiment

Figure 11:
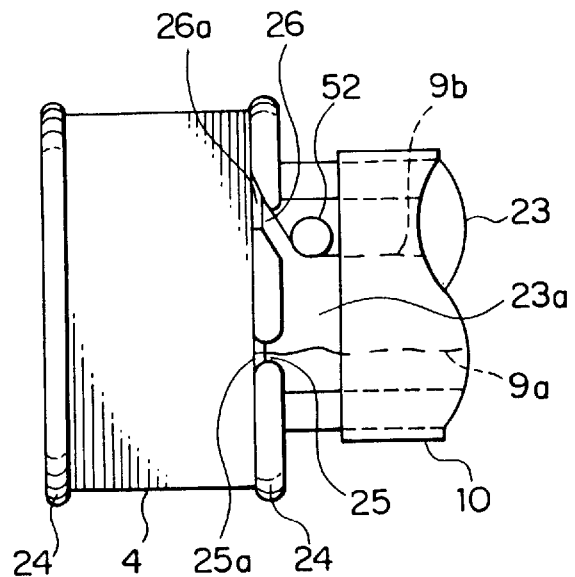
FIG. 11 is a plan view illustrating main parts of a magnetic sensor assembly according to a fourth embodiment of the invention.

FIG. 11 is a plan view illustrating the main parts of a magnetic sensor assembly according to a fourth embodiment of the invention. This fourth embodiment is different from the first embodiment in that a guide 52 is formed into a circular shape.

Fifth Embodiment

Figure 12:
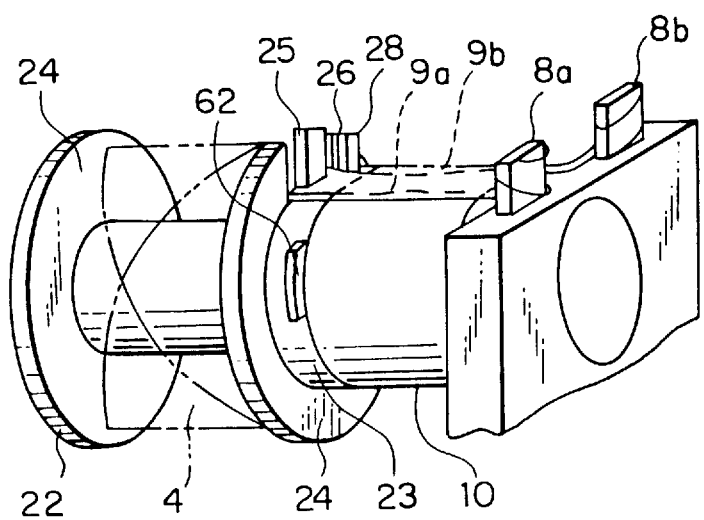
FIG. 12 is a perspective view illustrating the general structure of a magnetic sensor assembly according to a fifth embodiment of the invention.
Figure 13:
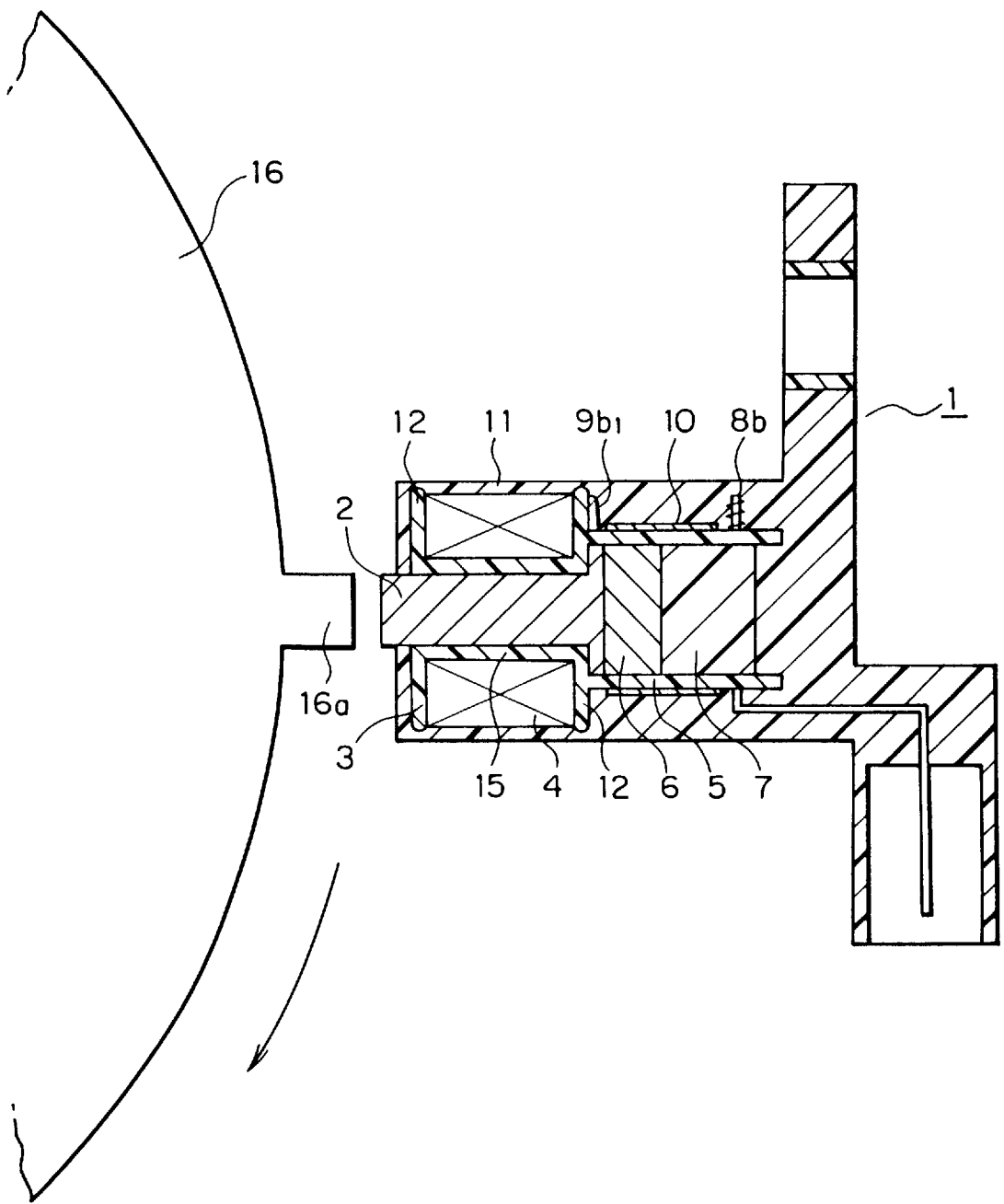
FIG. 13 is a cross-sectional view illustrating a conventional magnetic sensor in operation.
Figure 14:
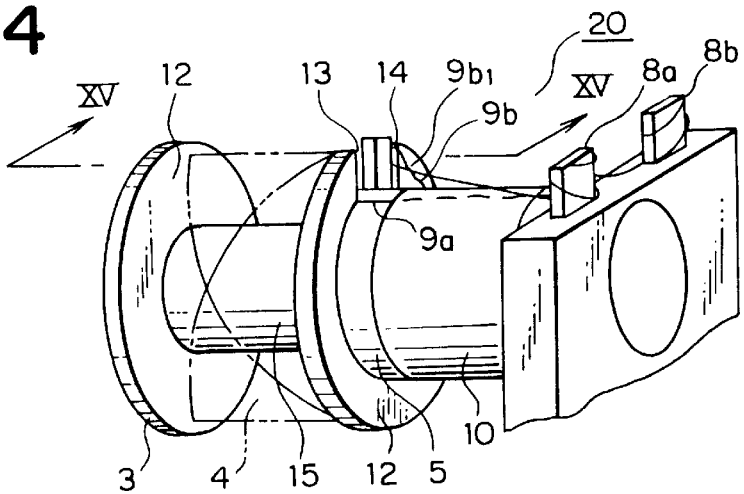
FIG. 14 is a perspective view illustrating the general structure of the conventional magnetic sensor before being placed into a housing.
Figure 15:
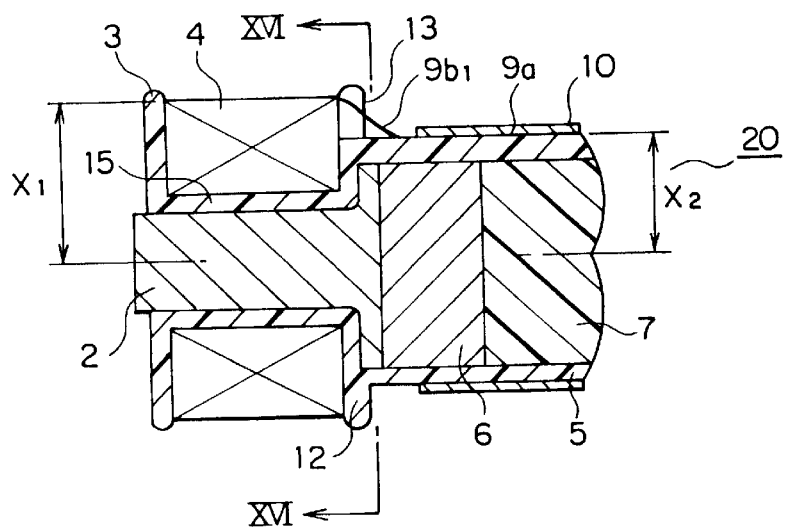
FIG. 15 is a cross-sectional view taken along line XV—XV of FIG. 14.
Figure 16:
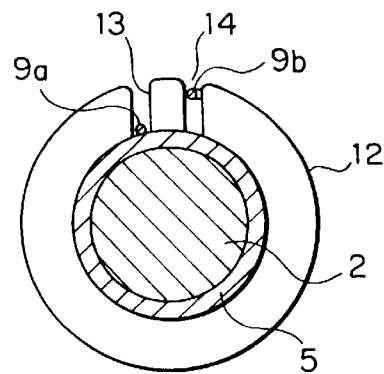
FIG. 16 is a cross-sectional view taken along line XVI—XVI of FIG. 15.

FIG. 12 is a perspective view illustrating the general structure of a magnetic sensor assembly according to a fifth embodiment of the invention. In this fifth embodiment, a rectangular-shaped positioning element 62 is additionally formed on the supporting element 23 of the first embodiment in such a manner that the positioning element 62 is located near the flange 24 disposed at the side of the supporting element 23 and in such a manner that the positioning element 62 and the supporting element 23 are formed in an integral fashion.

In the magnetic sensor according to this fifth embodiment, when an input lead wire 9a and an output leadwire 9b are fixed to a supporting element 23 by winding a band-shaped tape 10 around the outer periphery of the supporting element 23, a gap is produced between a side wall surface of the flange 24 and an end of the tape 10 because a guide 28 is disposed at a location apart from the flange 24 toward the electric terminals 8a and 8b. The positioning element 62 is for preventing the tape 10 from being shifted by the injection pressure when a molten resin is injected into a mold to form a housing 11. This ensures that the tape 10 can serve to firmly fix the input lead wire 9a and the output lead wire 9b.

Although in the embodiments described above, the supporting element 23 has a flat portion 23a, what is essential to the invention is that the output lead wire 9b is drawn out through the output lead slot at a height, measured in a radial direction, equal to the height of the outer surface of the adjacent portion of the supporting element and thus it is not necessarily required that the supporting element 23 have a flat portion as long as the above essential requirement is satisfied.

In the present invention, as described above, since the output lead wire is drawn out through the output lead slot at a height, measured in a radial direction, substantially equal to the height of the outer surface of the adjacent portion of the supporting element, the output lead wire is never separated from the outer surface of the supporting element even in the region near the flange, and thus, when a housing is formed by injection molding, the output lead wire can withstand the injection pressure of the molten resin with the help of the supporting element. That is, the injection pressure directly applied to the output lead wire is reduced, and therefore the coil is prevented from being damaged by the injection pressure of the molten resin.

If a flat portion is formed on the outer surface of the supporting element, it is possible to properly place the output lead wire extending from the coil onto the flat portion without encountering a shift in position of the output lead wire. This makes it possible to perform an assembly process to produce a magnetic sensor assembly in an easier and more reliable fashion.

Furthermore, according to the present invention, it is possible to draw the output lead wire though the output lead slot without damaging the output lead wire, by forming a contact portion in the output lead slot such that the contact portion has an acute angle with respect to the winding direction of the winding wire and further by forming a guide on the supporting element near the flange thereby guiding the output lead wire along the axis of the supporting element. This also allows an improvement in productivity in the assembly process to produce a magnetic sensor assembly.

Furthermore, in the present invention, the flange and the guide may be formed in an integral fashion so that the bobbin and the supporting element can be formed in an integral fashion by means of injection molding using a mold having a simple structure. This allows for a reduction in the cost required to produce the mold.

Furthermore, in the present invention, the corner portion of the output lead slot on its bottom and on the side near the winding core is formed into a curved surface so that the output lead wire can be drawn out smoothly through the output lead slot along the curved surface of the corner of the lead slot thereby ensuring that the output lead wire is drawn out without having damage.

Furthermore, the positioning element is disposed on the supporting element so that at least one end of the tape for fixing the output lead wire to the supporting element is positioned by the positioning element thereby ensuring that the tape can firmly fix the output lead wire to the supporting element without encountering a shift in the position of the tape when a molten resin is injected into a mold.

What is claimed is:

1. A magnetic sensor comprising:
    a bobbin having a winding core and flanges disposed at ends of the winding core;
    a supporting element connected to said bobbin;
    a magnet for generating a magnetic field, said magnet being disposed inside said supporting element;
    a coil for detecting a change in the magnetic field as a change in voltage, said coil comprising a winding wire wound around said winding core, an output lead wire of said coil being drawn out through an output lead slot formed in one of said flanges; and
    a resin housing injection molded over outer portions of said bobbin, said coil, and said supporting element,
    wherein said output lead wire is drawn out through said output lead slot at a height, measured in a radial direction of said bobbin, which is substantially equal to a height, measured in said radial direction, of an outer surface of an adjacent portion of said supporting element, and
    wherein said output lead wire is supported against the outer surface of the adjacent portion of said supporting element to prevent damage caused by an injection pressure of resin for forming said housing.

2. A magnetic sensor according to claim 1, wherein a flat portion is formed on the outer surface of said supporting element, and said output lead wire is placed on said flat portion.

3. A magnetic sensor according to claim 1, wherein a contact portion is formed in said output lead slot in such a manner that said contact portion forms an acute angle with respect to a winding direction of the winding wire, and a guide is formed on said supporting element near said one of said flanges so that said guide serves to guide said output lead wire along an axis of said supporting element.

4. A magnetic sensor according to claim 1, wherein a portion of said one of said flanges on a side of the output lead slot is bent at an acute angle with respect to a winding direction of the winding wire so as to form a guide for guiding the output lead wire.

5. A magnetic sensor according to claim 1, wherein a contact portion having a curved surface is formed in said output lead slot at a bottom of said slot and on a corner of said slot near said coil in such a manner that said curved surface extends along a direction in which said output lead wire extends.

6. A magnetic sensor according to claim 1, further comprising a positioning element on said supporting element and a tape adhered to said supporting element over said output lead wire for pressing and fixing said output lead wire against said supporting element, wherein said tape is positioned by said positioning element.

* * * * *